(12) United States Patent
Karhade et al.

(10) Patent No.: US 11,417,592 B2
(45) Date of Patent: Aug. 16, 2022

(54) METHODS OF UTILIZING LOW TEMPERATURE SOLDER ASSISTED MOUNTING TECHNIQUES FOR PACKAGE STRUCTURES

(71) Applicant: Intel Corporation, Santa Clara, CA (US)

(72) Inventors: Omkar G. Karhade, Chandler, AZ (US); Nachiket R. Raravikar, Saratoga, CA (US); Sandeep B. Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 603 days.

(21) Appl. No.: 16/328,617

(22) PCT Filed: Sep. 29, 2016

(86) PCT No.: PCT/US2016/054381
§ 371 (c)(1),
(2) Date: Feb. 26, 2019

(87) PCT Pub. No.: WO2018/063228
PCT Pub. Date: Apr. 5, 2018

(65) Prior Publication Data
US 2021/0287974 A1  Sep. 16, 2021

(51) Int. Cl.
*H01L 23/498* (2006.01)
*H01L 21/48* (2006.01)
*H01L 23/00* (2006.01)

(52) U.S. Cl.
CPC .... *H01L 23/49816* (2013.01); *H01L 21/4853* (2013.01); *H01L 21/4857* (2013.01); *H01L 23/49833* (2013.01); *H01L 23/562* (2013.01)

(58) Field of Classification Search
None
See application file for complete search history.

(56) References Cited

U.S. PATENT DOCUMENTS

| 4,193,530 A | * | 3/1980 | Holmes | B23K 35/262 |
| | | | | 220/678 |
| 2006/0043603 A1 | | 3/2006 | Ranade et al. | |
| 2007/0290345 A1 | | 12/2007 | Clevenger et al. | |

(Continued)

FOREIGN PATENT DOCUMENTS

KR 20110045163 5/2011

OTHER PUBLICATIONS

International Search Report and Written Opinion for International Patent Application No. PCT/US16/54381, dated Jun. 29, 2017.

*Primary Examiner* — Long Pham
(74) *Attorney, Agent, or Firm* — Essential Patents Group, LLP.

(57) ABSTRACT

Methods/structures of joining package structures are described. Those methods/structures may include a device disposed on first side of substrate and an array of conductive interconnect structures disposed on a second side of the first substrate. The conductive interconnect structures of the array may comprise a solder material, wherein the solder material comprises a low temperature alloying element concentration of less than about 5 percent. A second substrate is coupled to the array of conductive interconnect structures.

15 Claims, 8 Drawing Sheets

(56) References Cited

U.S. PATENT DOCUMENTS

2015/0221609 A1\* 8/2015 Srinivasan .............. H01L 24/81
 438/122
2015/0325507 A1 11/2015 Uzoh et al.

\* cited by examiner

METHODS OF UTILIZING LOW TEMPERATURE SOLDER ASSISTED MOUNTING TECHNIQUES FOR PACKAGE STRUCTURES

CLAIM OF PRIORITY

This Application is a National Stage Entry of, and claims priority to, PCT Application No. PCT/US16/54381, filed on Sep. 29, 2016 and titled "METHODS OF UTILIZING LOW TEMPERATURE SOLDER ASSISTED MOUNTING TECHNIQUES FOR PACKAGE STRUCTURES", which is incorporated by reference in its entirety for all purposes.

BACKGROUND OF THE INVENTION

Warpage in microelectronic package structures, especially in thin microelectronic packages, can be a fabrication challenge for semiconductor manufacturers. Differences in coefficients of thermal expansion (CTE) between various materials in the microelectronic package structures, such as differences between substrates and microelectronic die, for example, may contribute to such warpage, especially when the packaged die/device undergoes temperature cycling.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
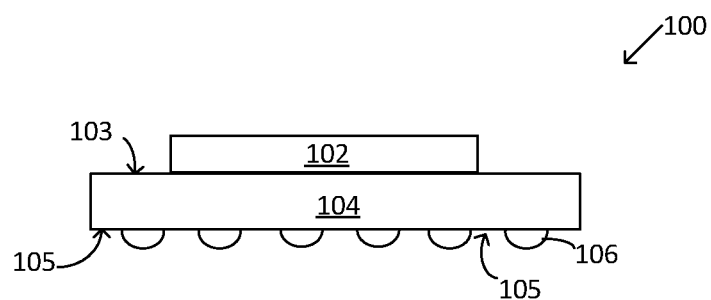
FIGS. 1a-1i represent cross-sectional views of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die/device. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die/device may comprise any type of integrated circuit device. In one embodiment, the die may include a processing system (either single core or multi-core). For example, the IC die may comprise a microprocessor, a graphics processor, a signal processor, a network processor, a chipset, etc. In one embodiment, the IC die 120 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices/die.

Conductive interconnect structures may be disposed on a side(s) of a die/device, and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder (e.g., in the form of balls or bumps) may be disposed on the terminals of the substrate and/or die/device, and these terminals may then be joined using a solder reflow process. Of course, it should be understood that many other types of interconnects and materials are possible (e.g., wirebonds extending between a die and a substrate).

The terminals on a die may comprise any suitable material or any suitable combination of materials, whether disposed in multiple layers or combined to form one or more alloys and/or one or more intermetallic compounds. For example, the terminals on die may include copper, aluminum, gold, silver, nickel, titanium, tungsten, as well as any combination of these and/or other metals. In other embodiments, a terminal may comprise one or more non-metallic materials (e.g., a conductive polymer). The terminals on a substrate may also comprise any suitable material or any suitable combination of materials, whether disposed in multiple layers or combined to form one or more alloys and/or one or more intermetallic compounds. For example, the terminals on substrate may include copper, aluminum, gold, silver, nickel, titanium, tungsten, as well as any combination of these and/or other metals. Any suitable solder material may be used to join the mating terminals of the die and substrate, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter the reflow temperature).

Embodiments of methods of forming packaging structures, such as methods of forming low temperature solder on high temperature solder balls to facilitate solder mounting process reliability, for example, are described. Those methods/structures may include forming a low temperature solder material comprising a low temperature solder alloying element, on a plurality of high temperature solder balls disposed on a side of a first substrate. A die is disposed on an opposite side of the first substrate. The low temperature solder material may be melted at a first temperature, wherein the low temperature solder material wets the surface of the high temperature solder balls. The plurality of solder balls may be attached to a second plurality of high temperature solder balls disposed on a second substrate, and the package structure may then be processed under a temperature higher than the low temperature solder material melting point, in order to form solder joints between the first and second substrates. The embodiments herein enable the formation of solder joints which display a high process margin in terms of package warpage.

FIGS. 1a-1i illustrate side cross-sectional views of embodiments of fabricating novel architectures utilizing low temperature solder materials, for surface mount techniques for use in microelectronic package/device structure fabrication. In FIG. 1a (cross-sectional view), a portion of package structure 100, which may comprise a die 102, on a first side 103 of a substrate 104. The package structure 100 may comprise a microelectronic package structure in an embodiment. The substrate 104, which may comprise a first substrate 104 in an embodiment, may comprise any suitable substrate materials, such as but not limited to dielectric and conductive materials, for example. In an embodiment, conductive interconnect structures 106, may be disposed on a bottom/second side 105 of the first substrate 104, and may comprise a first array of conductive interconnect structures 106.

The conductive interconnect structures 106 may comprise a first array of solder balls for example, such as ball gird arrays, in some embodiments, and may comprise conductive materials, such as a copper material. The conductive interconnect structures 106 may comprise conductive structures which may serve to couple the first substrate 104 with another substrate, such as a motherboard, for example. In an embodiment, the conductive interconnect structures 106 may comprise a high temperature solder material, such as a tin-gold-copper (SAC) material for example. In an embodiment, the high temperature solder material may melt at about or above about 240 degrees Celsius.

Figure 1B:
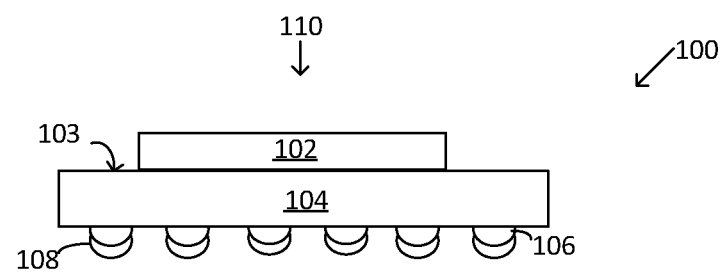
Figure 1C:
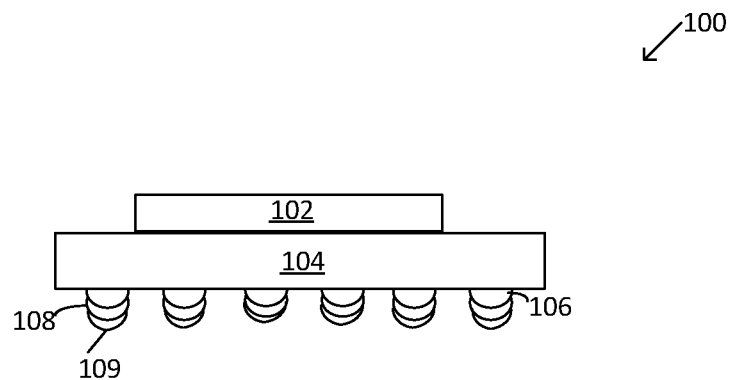
Figure 1D:
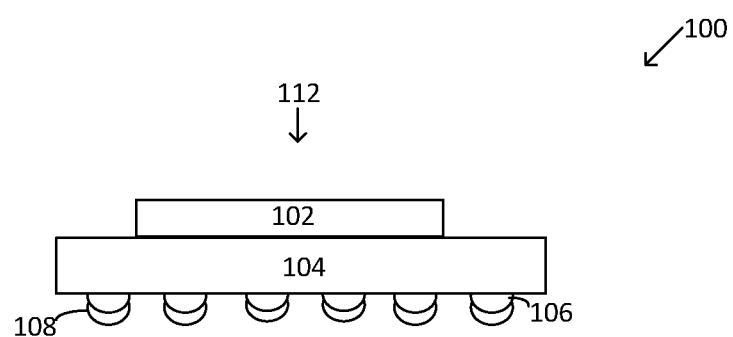

In an embodiment, a low temperature solder material/coating 108 may be formed on at least a portion of the first array of conductive interconnect structures 106 (FIG. 1b). In an embodiment, the low temperature solder material/coating may be directly disposed on the first array of conductive interconnect structures 106. In an embodiment, the low temperature solder material 108 may comprise a concentration of a low temperature solder alloying element(s)/species, such as bismuth and/or indium, for example. In an embodiment, the low temperature solder alloying element(s) may comprise any suitable chemical element/species, such that the low temperature solder alloying element enables the melting temperature of the low temperature solder material 108 to be less than about 200 degrees Celsius.

In an embodiment, the low temperature solder coating 108 may comprise about 40 percent or less of the low temperature solder alloying element(s). In another embodiment, the low temperature solder coating 108 may comprise between about 30 to about 50 percent of the low temperature solder alloying element. The low temperature solder material 108 may further comprise such materials as tin, gold and copper, and other solder materials, according to the particular application. In an embodiment, the low temperature solder alloying element may form alloys/intermetallic structures with the balance of the species/elements (such as with tin, gold and/or copper) within the low temperature solder coating 108, such that the alloy/intermetallic formation within the low temperature solder material/coating 108 reduces the temperature of the low temperature solder material/coating.

In an embodiment, the low temperature solder material 108 may comprise a melting temperature of between about 140 to about 200 degrees Celsius, for example. In another embodiment, the melting/wetting temperature of the low temperature solder material may comprise a melting temperature of about 100 degrees lower than the melting temperature of the high temperature solder material of the conductive interconnect structures 106. In an embodiment, the low temperature solder material/coating 108 may comprise a melting temperature of below about 200 degrees Celsius.

In an embodiment the low temperature solder coating 108 may comprise a thickness of about 40 microns or less. In an embodiment, the low temperature solder may be sputtered through a stencil(s) onto the first array of conductive interconnect structures 106. In another embodiment, the package structure 100 may be dipped into the low temperature solder material 108 at such a temperature that the low temperature solder melts, but the high temperature solder of the conductive interconnect structures 106 does not melt. In another embodiment, the package structure 100 may be manufactured on strip or panel level, wherein the low temperature solder 108 can then be plated onto the array of solder balls 106.

In an embodiment, a layer of nickel 109 may optionally be formed on the low temperature solder material 108 (FIG. 1c), and may comprise a thickness of about 5 microns or less, in an embodiment. The nickel layer 109 may serve to lessen the amount of solid state diffusion that may occur between the low temperature coating 108 and the high temperature solder material of the conductive interconnect arrays 106 during subsequent temperature processing.

In an embodiment, the low temperature solder material 108 can be melted/become wetted to form a uniformly thick coating over the solder balls 108 (FIG. 1*d*), prior to being mounted onto another substrate, such as onto a motherboard, for example. In an embodiment, the low temperature solder material may be prevented from mixing (experiencing solid state diffusion) with the high temperature solder material before the package structure 100 is mounted upon another substrate. In some cases, the thickness of the low temperature solder coating 108 may be optimized to prevent solid state diffusion that may occur during a wetting process/temperature, prior to a solder mounting processing.

The low temperature solder material 108 may undergo a temperature process 112, in an embodiment. The temperature process 112 may comprise a wetting temperature, wherein the temperature may be such that the low temperature solder material wets/melts onto the conductive balls 106, but does not diffuse into the first array of solder balls 106. In an embodiment, there is no solid state diffusion between the array of solder balls 106 and the low temperature solder material 108 during the first temperature process 112. In an embodiment, the temperature process 112 may comprise a temperature of between about 140 to about 160 degrees Celsius, and may comprise a melting temperature of the low temperature solder material 108.

Figure 1E:
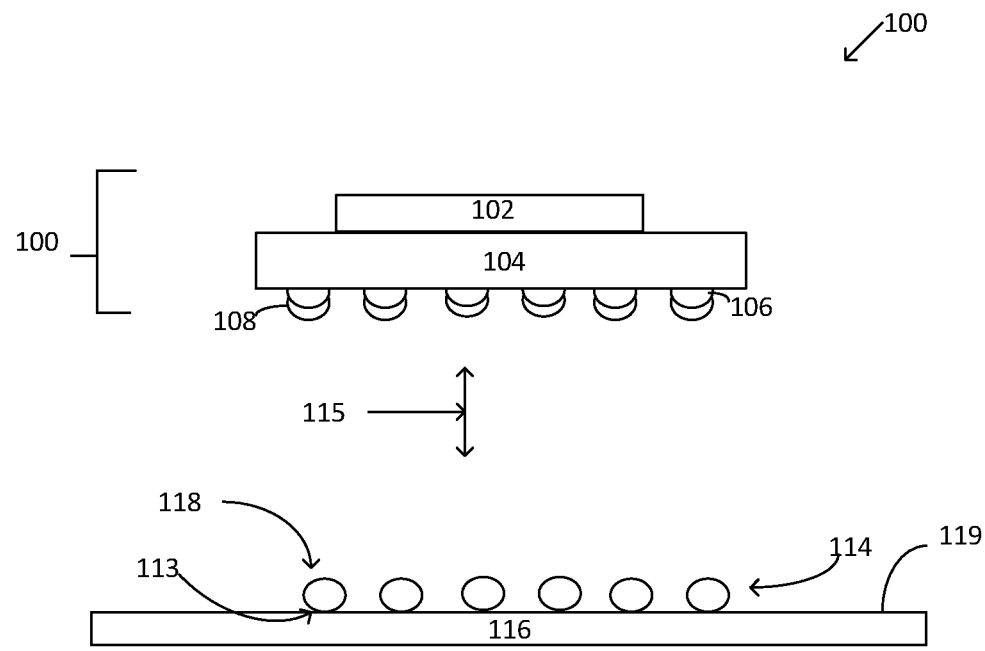

In another embodiment, the package structure 100 may be attached to a second substrate 116 utilizing any suitable attachment process 115 (FIG. 1*e*). In an embodiment, the second substrate 116 may comprise a motherboard, but may comprise any other type of substrate 116 that may be suitable for the particular application. In an embodiment, the second substrate 116 may comprise a second plurality of solder balls/conductive interconnect structures 114 that may be disposed on a first side 119 of the second substrate 116. In an embodiment, the second plurality/array of conductive interconnect structures 114 may comprise a first side 118 and a second side 113. In an embodiment, the second array of conductive solder balls 114 may comprise a high temperature solder material, and may comprise such materials as tin, gold and copper, for example. The second array of conductive solder balls 114 may comprise a melting temperature of about 240 degrees to about 260 degrees Celsius, in an embodiment. In an embodiment, the second array of conductive balls 114 may comprise a solder paste on at least a portion of each of the individual ones of the second array of conductive solder balls 114.

Figure 1F:
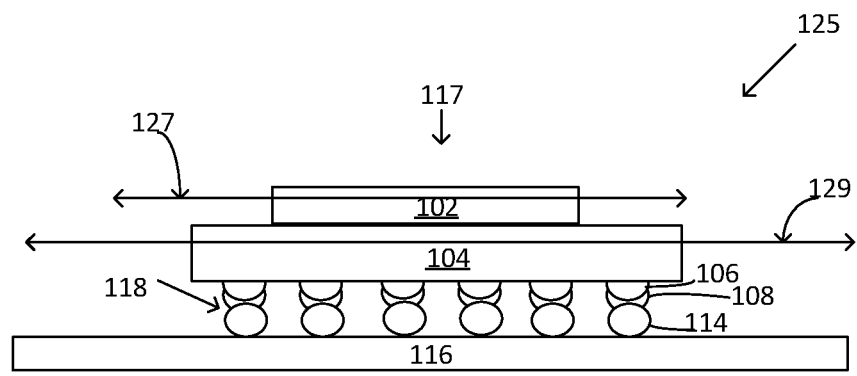

In an embodiment, the first array of conductive structures 106, comprising the low temperature solder material 108 and optionally the nickel layer 109 (not shown) of the package structure 100, may be mounted onto the first side 118 of the second array of conductive interconnect structures 114 (FIG. 1*f*). In an embodiment, the attachment process 115, which may comprise a surface mount process 115, may be utilized to directly attach/join the first array of conductive solder balls 106 of the package structure 100 onto the second array of conductive solder balls 114 that are disposed on the second substrate 116.

Figure 1G:
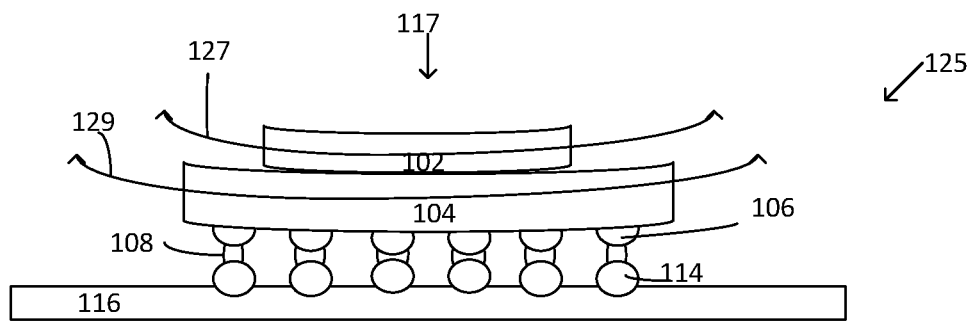

When the first and second arrays of solder balls 106, 114 are mated/attached, the joined structure 125 may experience a reflow temperature cycling process 117 (FIGS. 1*f*-1*g*). In an embodiment, when the first and second arrays of conductive interconnect structures 106, 114 experience a first temperature (which may be a melting temperature of the low temperature solder material 108) of about 140 to about 200 degrees Celsius, the joined package structure 125 may comprise a substantially flat profile, and may not comprise any significant warpage (FIG. 1*f*). For example, a die profile 127 and a substrate profile 129 may both be substantially flat at the first temperature.

In an embodiment, the low temperature solder material 108 may be directly disposed on the first array of solder balls 106 and may be directly disposed on the second array of solder balls 114. In an embodiment, a solder paste may be disposed on a portion of the second array of solder balls 114 (not shown), and the low temperature solder material 108 may be directly disposed on the solder paste. The solder paste may comprise such materials as tin, silver, and copper mixed with a tacky flux material, for example. At the first temperature, the low temperature solder material 108 may wet the solder paste on the second array of solder balls 114. For example, the low temperature solder coating 108 may wet the solder balls 114, but will not diffuse into the second array of conductive solder balls 114, and will likewise not diffuse into the first array of conductive solder balls 106. The first temperature/melting temperature of the reflow process 117 may vary depending upon the amount of low temperature solder alloying element in the low melting point solder material, for example.

At a second temperature of about 240 to about 270 degrees Celsius, during the reflow process 117, the solder material of the second array of solder balls 114 (and the first array of solder balls 106) may begin to melt (FIG. 1*g*). In an embodiment, the package structure 125 may comprise die and first substrate profiles 127, 129 that may exhibit slight to moderate curvature/warpage. However, the low temperature solder material 108 serves to keep the first and second solder ball arrays 106, 114 together, thus minimizing the amount of curvature/warpage that the die/device 102 and/or substrate 104 may experience.

In an embodiment, the low temperature solder material 108 may exert/apply a surface tension such that there is a pulling force upon the solder ball arrays 106, 114 that pulls them together during the reflow process 117, as the second array 114 (and first array 106) of solder balls melt. Thus, the low temperature solder material 108 between the first and second arrays of solder balls 106, 114 serves to flatten the warpage that may occur during the reflow process 117, and serves also to avoid open contacts that may gave occurred between the solder ball arrays 106, 114 without the low temperature solder material 108. In an embodiment, the low temperature solder material 108 may become absorbed into the first and second solder ball arrays 106, 114 during the application of the second temperature.

Figure 1H:
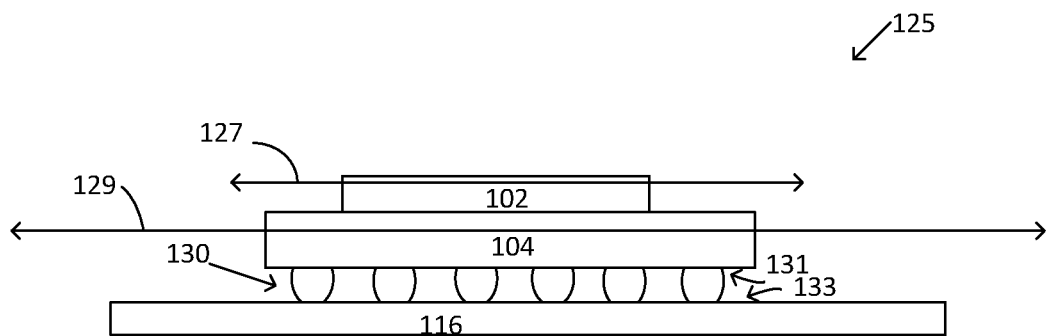

In an embodiment the package structure 125 may be brought back to room temperature to form an array of joint structures/conductive interconnect structures 130 (FIG. 1*h*). In an embodiment, the array of joint structures 130 may comprise the result of the solid state diffusion between the first array of conductive interconnect structures 106, the low temperature solder coating 108, and the second array of conductive interconnect structures 114, subsequent to the reflow temperature of above about 240 degrees Celsius. In an embodiment, a first side 132 of the array of joint structures 130 may be disposed on a second side of the first substrate 104, and a second side 133 of the array of joint structures/conductive interconnect structures may be disposed on a first side of the second substrate 116. In an embodiment, the die/device 102 and first substrate 104 profiles 127, 129 may comprise substantially flat profiles (no significant curvature/warpage).

The array of joint structures 130 may comprise a lower concentration of low temperature solder alloying element(s)

after temperature/reflow processing than prior to the reflow process, and in some embodiments, the solder material of individual ones of the array of conductive interconnect structures 130 may comprise less than about 5 percent of the low temperature solder alloying element. In an embodiment, the solder material of the conductive interconnect structures may comprise about 5 percent of the low temperature solder alloying element distributed throughout the formed joint structures 130. In an embodiment, the joint structures 130 may largely comprise the high temperature solder material, and in some cases, may comprise a melting temperature of above about 200 degrees Celsius.

Figure 1I:
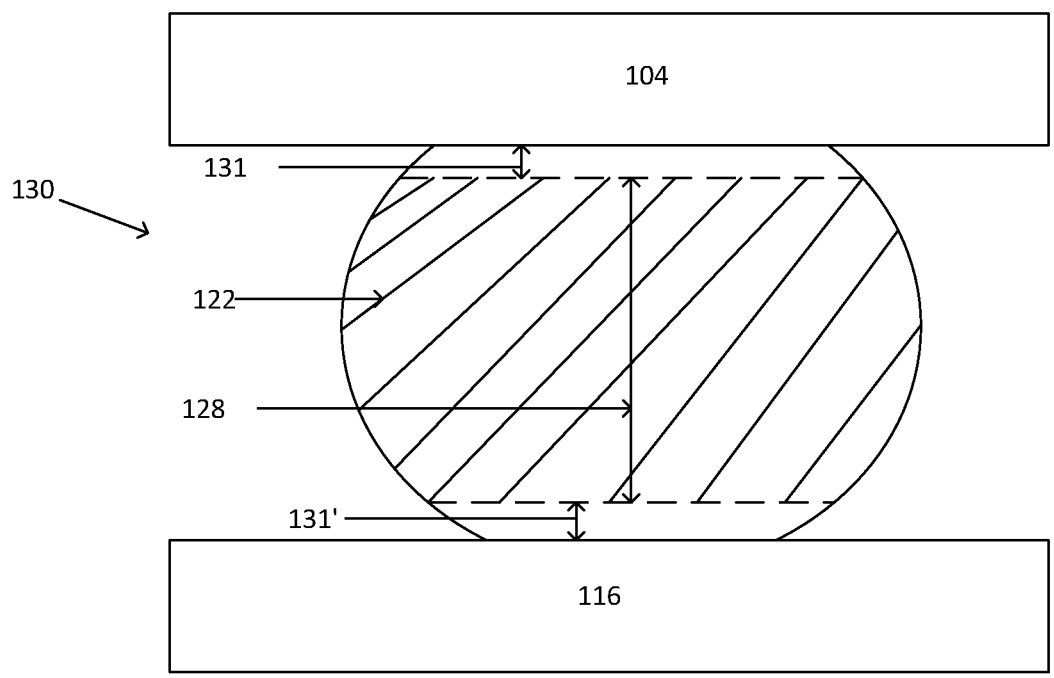

FIG. 1i depicts an embodiment of an individual joint structure 130, (such as an individual one of the array of joint structures/conductive interconnect structures 130 of FIG. 1h), disposed between first and second substrates 104, 116, wherein a low temperature solder alloying element concentration 122 may be larger in a first region 128 than in a second region(s) 131, 131'. In an embodiment, the first region 128 may be farther away from the substrates 104, 116 than the second regions(s) 131, 131', which may be closer to the substrates 104, 116. In another embodiment, the concentration of the low temperature solder alloying element 122 may be substantially uniform between the substrates 104, 116, wherein the amount of low temperature solder alloying element species/atoms may be about the same in the first region 128 and the second region(s) 131, 131'. In an embodiment, the low temperature solder alloying element concentration may comprise about 5 percent or less of the joint 130 material composition. In an embodiment, the balance of the material composition of the joint 130 may comprise a solder material, such as a high temperature solder material. In an embodiment, the species present within the joint may comprise solder material, such as tin, gold and copper, for example. The use of the low temperature solder between the two solder ball arrays increases the reliability and reduces the amount of contact opens of the joined package structure 125.

The various embodiments of the package assemblies/structures described herein eliminate/reduce the need for the use of thicker substrates, (which do not meet package thickness requirements), metal stiffeners (which utilize package real estate) and ultra-thin die (which affect die stress), for example. The use of low temperature solder for second level interconnects, for example, enables the formation of reliable joints with no contact open failures. The embodiments further enable the use of thinner, smaller Z height packages without incurring yield loss from package warpage, and gives more solder mounting process margin in terms of minimizing package warping during/subsequent to reflow temperatures. Since the bulk of the solder joints formed according to the embodiments herein are largely comprised of high temperature solder, the solder joints herein exhibit the joint reliability associated with high temperature solder.

Figure 2:
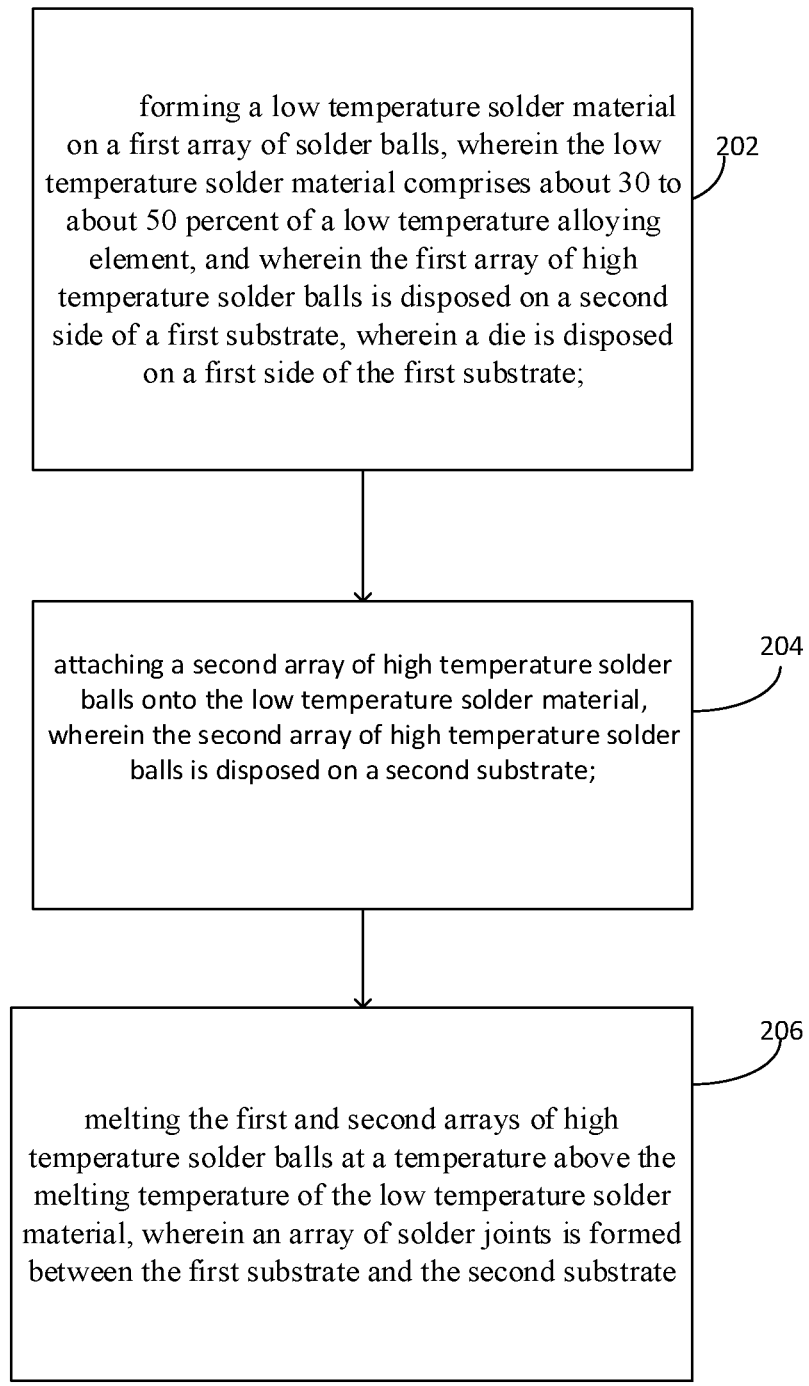
FIG. 2 represents a flow chart of a method according to embodiments.

FIG. 2 depicts a method according to embodiments herein. At step 202, a low temperature solder material may be formed comprising a low temperature solder alloying element, on a first array of high temperature solder balls, wherein the first array of high temperature solder balls is disposed on a second side of a first substrate, and wherein a die is disposed on a first side of the first substrate. The low temperature solder material may comprise a low temperature alloying element(s), such as bismuth and/or indium, for example. In an embodiment, the low temperature alloying element(s) may be about 30 to about 50 percent of the low temperature solder material, and the melting temperature of the low temperature solder material is less than about 200 degrees Celsius. In an embodiment, the low temperature alloying element(s) may form alloys and/or intermetallic structures/regions with the balance of the low temperature solder material, wherein the balance of the low temperature solder material may comprise such solder materials as tin, gold and copper, for example. The low temperature alloying element(s) may serve to reduce a melting/wetting temperature of the low temperature solder material.

At step 204, a second array of high temperature solder balls may be attached onto the low temperature solder material, wherein the second array of high temperature solder balls is disposed on a second substrate. In an embodiment, the second substrate may comprise a motherboard, and the attachment process may comprise a surface mount attachment process. At step 206, the first and second arrays of high temperature solder balls may be melted at a temperature above the melting temperature of the low temperature solder material, wherein an array of solder joints may be formed between the first substrate and the second substrate. In an embodiment, the melting temperature of the high temperature first and second arrays of solder balls may comprise above about 240 degrees Celsius.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 3:
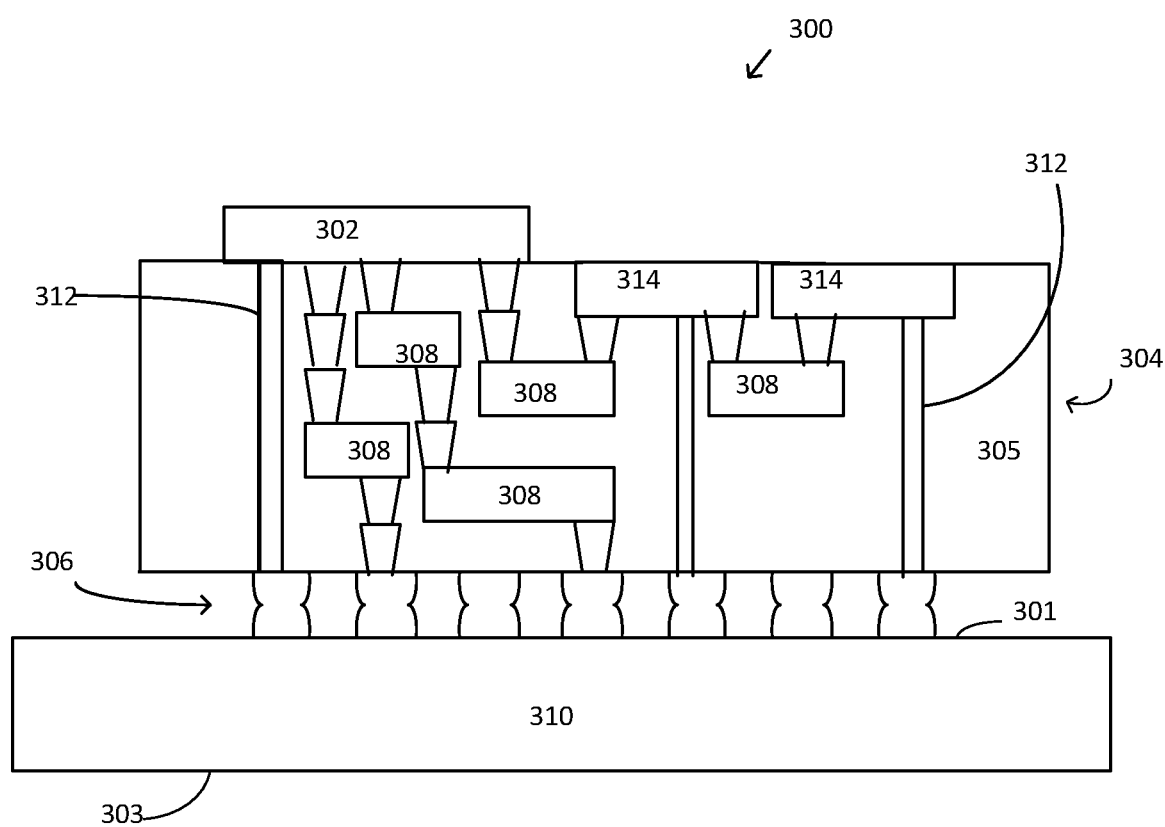
FIG. 3 represents a computer system implementing one or more embodiments.

Turning now to FIG. 3, illustrated is an embodiment of a computing system 300. The system 300 includes a mainboard 310 or other circuit board. Mainboard 310 includes a first side 301 and an opposing second side 303, and various components may be disposed on either one or both of the first and second sides 301, 303. In the illustrated embodiment, the computing system 300 includes a die 302, disposed on a substrate 304. The substrate 304 may comprise an interposer 304, for example. The substrate 304 may comprise various levels of conductive layers 314, 308, for example, which may be electrically and physically connected to each other by via structures 310. The substrate 304 may further comprise through substrate vias 312. Dielectric material 305 may separate/isolate conductive layers from each other within the substrate 304. Joint structures 306, similar to the joint structures 130 of FIG. 1h, for example, may electrically and physically couple the substrate 304 to the board 310. The computing system 300 may comprise any of the embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

Figure 4:
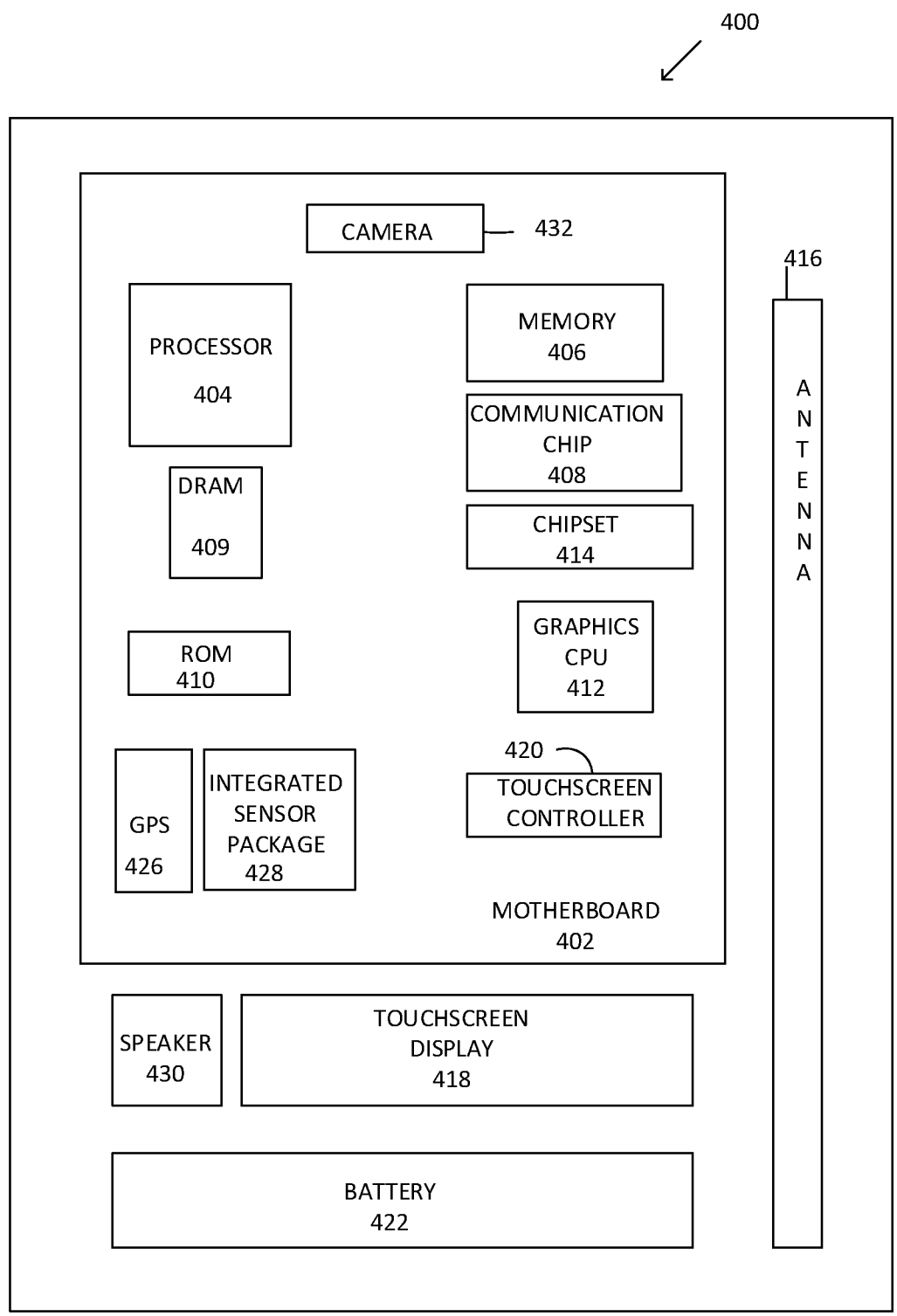
FIG. 4 represents a schematic of a computing device according to embodiments.

FIG. 4 is a schematic of a computing device 400 that may be implemented incorporating embodiments of the package structures described herein. For example, any suitable ones of the components of the computing device 400 may include, or be included in, package structures of the various embodiments disclosed herein. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, an integrated sensor 428, a speaker 430, a camera 432, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a die on a first side of a first substrate. a first array of conductive interconnect structures is on a second side of the first substrate, wherein the first array of conductive interconnect structures comprises a high temperature solder material. A low temperature solder coating is disposed on at least a portion of the first array of conductive interconnect structures, wherein the low temperature solder coating comprises a low temperature solder alloying element, wherein the low temperature solder comprises a concentration of about 30 to about 50 percent of the low temperature solder ally element. The low temperature solder coating melts below about 200 degrees Celsius.

Example 2 includes the structure of example 1 wherein a first side of a second array of conductive interconnect structures is disposed on the low temperature solder coating, wherein the second array of conductive interconnect structures comprise a high temperature solder material, wherein a melting temperature of the second array of conductive interconnect structures is above about 240 degrees Celsius.

Example 3 includes the structure of example 2 wherein a second side of the second array of conductive interconnect structures is disposed on a second substrate.

Example 4 includes the structure of example 1 wherein the low temperature solder coating is not diffused into the first array of conductive interconnect structures. Example 5 includes the structure of example 3 wherein the low temperature solder alloying element comprises at least one of bismuth or indium.

Example 6 includes the structure of example 1 wherein the high temperature solder material comprises at least one of gold, tin or copper, and comprises a melting temperature of above about 240 degrees Celsius.

Example 7 includes the structure of example 1 wherein the low temperature solder coating comprises a thickness of about 10 microns to about 40 microns.

Example 8 includes the structure of example 1 wherein a nickel layer is disposed on the low temperature solder coating.

Example 9 is a microelectronic package structure comprising a device disposed on a first side of a first substrate, a first side of an array of conductive interconnect structures disposed on a second side of the first substrate. Individual ones of the array of conductive interconnect structures comprise a solder material, wherein the solder material comprises a concentration of a low temperature solder alloy element of less than about 5 percent. A second substrate is coupled to a second side of the array of conductive interconnect structures Example 10 includes the structure of example 9 wherein the solder material comprises at least one of tin, gold or copper.

Example 11 includes the structure of example 9 wherein the low temperature solder alloy element concentration comprises a larger concentration in a central portion of the solder material Example 12 includes the structure of example 9 wherein the low temperature solder alloying element comprises a uniform distribution within the solder material.

Example 13 includes the structure of example 9 wherein the wherein the second substrate comprises a motherboard.

Example 14 includes the structure of example 9 wherein the solder material comprises a melting point of above about 240 degrees Celsius.

Example 15 includes the structure of example 9 wherein the array of conductive interconnect structures comprises a ball grid array.

Example 16 includes the structure of example 9 wherein the low temperature alloying element comprises at least one of indium or bismuth.

Example 17 is a method of forming a microelectronic package structure, comprising forming a low temperature solder material comprising a low temperature alloying element disposed on a first array of high temperature solder balls, wherein the first array of high temperature solder balls is disposed on a second side of a first substrate, and wherein a die is disposed on a first side of the first substrate, attaching a second array of high temperature solder balls onto the low temperature solder material, wherein the second array of high temperature solder balls is disposed on a second substrate, and melting the first and second arrays of high temperature solder balls at a temperature above the melting temperature of the low temperature solder material, wherein an array of solder joints is formed between the first substrate and the second substrate.

Example 18 includes the method of example 17 further comprising melting the low temperature solder material at a melting temperature below the melting temperature of the high temperature solder balls, wherein the low temperature solder material does not diffuse into the first or second arrays of solder balls.

Example 19 includes the method of example 17 wherein forming the low temperature solder material comprises sputtering the low temperature solder material on the first array of high temperature solder balls.

Example 20 includes the method of example 17 further comprising forming a nickel layer on the low temperature solder material.

Example 21 includes the method of example 17 wherein individual ones of the array of solder joints comprise a low temperature alloying element concentration below about 5 percent.

Example 22 includes the method of example 17 further comprising wherein the high temperature solder material comprises a melting point of above about 240 degrees.

Example 23 includes the method of example 17 further comprising further comprising wherein the low temperature solder material comprises a thickness of less than about 40 microns.

Example 24 includes the method of example 17 further comprising wherein the concentration of low temperature alloying element is higher in a mid-portion of individual ones of the array of joint structures.

Example 25 includes the method of example 17 wherein the second substrate comprises a motherboard.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
    a die on a first side of a first substrate;
    a first array of conductive interconnect structures on second side of the first substrate, wherein the first array of conductive interconnect structures comprises a high temperature solder material; and
    a low temperature solder coating on at least a portion of the first array of conductive interconnect structures, wherein the low temperature solder coating comprises a low temperature solder alloying element, wherein the low temperature solder coating comprises a concentration of between about 30 to about 50 percent of the low temperature solder alloying element, and wherein the low temperature solder coating melts below about 200 degrees Celsius.

2. The microelectronic package structure of claim 1, wherein a first side of a second array of conductive interconnect structures is disposed on the low temperature solder coating, wherein the second array of conductive interconnect structures comprise a high temperature solder material, wherein a melting temperature of the second array of conductive interconnect structures is above about 240 degrees Celsius.

3. The microelectronic package structure of claim 1, wherein a second side of the second array of conductive interconnect structures is disposed on a second substrate.

4. The microelectronic package structure of claim 1, wherein the low temperature solder coating is not diffused into the first array of conductive interconnect structures.

5. The microelectronic package structure of claim 3, wherein the low temperature solder alloying element comprises at least one of bismuth or indium.

6. The microelectronic package structure of claim 1, wherein the high temperature solder material comprises at least one of gold, tin or copper, and comprises a melting temperature of above about 240 degrees Celsius.

7. The microelectronic package structure of claim 1, wherein the low temperature solder coating comprises a thickness of about 10 microns to about 40 microns.

8. The microelectronic package structure of claim 1, wherein a nickel layer is disposed on the low temperature solder coating.

9. A microelectronic package structure comprising:
a device disposed on a first side of a first substrate;
a first side of an array of conductive interconnect structures disposed on a second side of the first substrate, wherein individual ones of the array of conductive interconnect structures comprise a solder material, wherein the solder material comprises a concentration of a low temperature alloying element of less than about 5 percent, wherein the low temperature alloying element concentration comprises a larger concentration in a central portion of the solder material; and
a second substrate, wherein the second substrate is coupled to a second side of the array of conductive interconnect structures.

10. The microelectronic package structure of claim 9, wherein the solder material comprises at least one of tin, gold or copper.

11. The microelectronic package structure of claim 9, wherein the low temperature alloying element comprises a uniform distribution within the solder material.

12. The microelectronic package structure of claim 9, wherein the second substrate comprises a motherboard.

13. The microelectronic package structure of claim 9, wherein the solder material comprises a melting point of above about 240 degrees Celsius.

14. The microelectronic package structure of claim 9, wherein the array of conductive interconnect structures comprises a ball grid array.

15. The device structure of claim 9, wherein the low temperature alloying element comprises at least one of indium or bismuth.

\* \* \* \* \*